(12) United States Patent
Kim

(10) Patent No.: US 11,783,884 B2
(45) Date of Patent: Oct. 10, 2023

(54) SEMICONDUCTOR MEMORY DEVICE AND MEMORY SYSTEM INCLUDING THE SAME

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/505,284

(22) Filed: Oct. 19, 2021

(65) Prior Publication Data

US 2022/0189533 A1 Jun. 16, 2022

Related U.S. Application Data

(60) Provisional application No. 63/123,695, filed on Dec. 10, 2020.

(30) Foreign Application Priority Data

Jan. 19, 2021 (KR) ........................ 10-2021-0007434

(51) Int. Cl.
 *G11C 11/406* (2006.01)
 *G11C 7/10* (2006.01)
 *G11C 11/408* (2006.01)

(52) U.S. Cl.
 CPC ...... *G11C 11/40615* (2013.01); *G11C 7/1039* (2013.01); *G11C 11/4085* (2013.01); *G11C 11/40622* (2013.01)

(58) Field of Classification Search
 CPC .............................................. G11C 11/40615
 See application file for complete search history.

(56) References Cited

U.S. PATENT DOCUMENTS

| 5,987,632 A  * | 11/1999 | Irrinki ................... G11C 29/72 |
| | | 714/6.32 |
| 6,272,588 B1 | 8/2001 | Johnston et al. |
| 9,396,786 B2 * | 7/2016 | Yoon ................. G11C 11/40611 |
| 9,858,982 B1 * | 1/2018 | Kim ....................... G11C 11/406 |

(Continued)

FOREIGN PATENT DOCUMENTS

| KR | 1020130115066 A | 10/2013 |
| KR | 1020190121585 A | 10/2019 |

OTHER PUBLICATIONS

Hou et al., A Built-in Self-Repair Scheme for DRAMs with Spare Rows, Columns and Bits, 2016 IEEE International Test Conference (ITC), Nov. 15-17, 2016, pp. 1-7, IEEE, USA.

(Continued)

*Primary Examiner* — Min Huang
(74) *Attorney, Agent, or Firm* — IP & T GROUP LLP

(57) ABSTRACT

A memory system includes: a memory controller suitable for: generating a first target address by sampling an active address according to an active command, providing the active address together with the active command, and providing a first target refresh command together with the first target address; and a memory device suitable for: generating a second target address by sampling the active address according to the active command, performing a target refresh operation on at least one word line corresponding to the first target address according to the first target refresh command, and performing the target refresh operation on at least one word line corresponding to the second target address according to a second target refresh command.

21 Claims, 9 Drawing Sheets

(56) References Cited

U.S. PATENT DOCUMENTS

| | | |
|---|---|---|
| 2008/0165599 A1 | 7/2008 | Gorman |
| 2014/0006704 A1 | 1/2014 | Greenfield et al. |
| 2017/0263305 A1* | 9/2017 | Cho .................... G11C 11/408 |
| 2017/0278583 A1 | 9/2017 | Raghuraman et al. |
| 2018/0158507 A1 | 6/2018 | Bang |
| 2021/0350844 A1* | 11/2021 | Morohashi ........ G11C 11/40611 |

OTHER PUBLICATIONS

Office Action for the U.S. Appl. No. 17/511,222 issued by the USPTO dated Feb. 2, 2023.

* cited by examiner

SEMICONDUCTOR MEMORY DEVICE AND MEMORY SYSTEM INCLUDING THE SAME

CROSS-REFERENCE TO RELATED APPLICATIONS

The present application claims the benefit of U.S. Provisional Patent Application No. 63/123,695, filed on Dec. 10, 2020, and Korean Patent Application No. 10-2021-0007434, filed on Jan. 19, 2021, which are both incorporated herein by reference in their entirety.

BACKGROUND

1. Field

Various embodiments of the present invention relate to a semiconductor design technology, and more particularly, to a memory system including a semiconductor memory device that performs a target refresh operation.

2. Description of the Related Art

A memory cell of a semiconductor memory device includes a transistor that functions as a switch and a capacitor that stores charges (or data). Data is determined to be at a logic high level (logic level 1) and at a logic low level (logic level 0) according to whether there is any charge in the capacitor of a memory cell, that is, whether the terminal voltage of the capacitor is high or low.

Data are stored in a form in which charges are accumulated in a capacitor, and theoretically, there is no power consumption. However, since there may be a leakage current due to such reasons as a PN coupling of a transistor, the initial amount of charges stored in the capacitor may disappear, which leads to the loss of data. To prevent this from occurring, the data in a memory cell should be read before the data gets lost, and the normal amount of charges according to the read data should be recharged back into the memory cell. The data may be retained only when such an operation is repeated periodically, and the process of recharging cell charges is referred to as a refresh operation which will be, hereinafter, referred to as a normal refresh operation.

Recently, in addition to the normal refresh operation, an additional refresh operation which will be, hereinafter, referred to as a 'target refresh operation', is being performed on the memory cells of a specific word line that is likely to lose data due to row hammering. The row hammering phenomenon refers to a phenomenon in which data of memory cells coupled to a specific word line or the word lines disposed adjacent to the word line are damaged due to a high number of activations of the corresponding word line. In order to prevent the row hammering phenomenon, a target refresh operation is performed on a word line that is activated more than a predetermined number of times which is, hereinafter, referred to as a 'target word line', and the word lines disposed adjacent to the word line.

In order to select a word line to be refreshed during the target refresh operation, the memory device needs to count all addresses inputted with an active command. The memory device has counting circuits to count the number of inputs of the addresses, and as technological scaling progresses, the smaller the size of the memory device, the larger the portion that the counting circuits occupy.

SUMMARY

Embodiments of the present invention are directed to a memory system capable of allowing a memory controller and a memory device to collaboratively generate target addresses each target address for selecting at least one word line to be refreshed during a target refresh operation.

According to an embodiment of the present invention, a memory system includes: a memory controller suitable for: generating a first target address by sampling an active address according to an active command, providing the active address together with the active command, and providing a first target refresh command together with the first target address; and a memory device suitable for: generating a second target address by sampling the active address according to the active command, performing a target refresh operation on at least one word line corresponding to the first target address according to the first target refresh command, and performing the target refresh operation on at least one word line corresponding to the second target address according to a second target refresh command.

According to an embodiment of the present invention, a semiconductor memory device includes a first latch suitable for outputting a first target address by latching an internal address according to a first target refresh command; a second latch suitable for outputting an active address by latching the internal address according to an active command; a second random sampling circuit suitable for generating sampling addresses by randomly sampling the active address; an output control circuit suitable for sequentially outputting the sampling addresses as a second target address according to a second target refresh command, while masking a current sampling address in response to a comparison signal; and an address select circuit suitable for outputting a final target address by selecting any of the first target address and the second target address according to the second target refresh command, and generating the comparison signal, when the first target address is the same as the second target address, by comparing the first target address with the second target address.

According to an embodiment of the present invention, an operation method of a memory system includes generating, at a memory controller, a first target address by sampling an active address according to an active command; providing, at the memory controller, the active address together with the active command; providing, at the memory controller, a first target refresh command together with the first target address; performing, at a memory device, a target refresh operation on at least one word line corresponding to the first target address according to the first target refresh command; generating, at the memory device, a second target address by sampling the active address according to the active command; and performing, at the memory device, the target refresh operation on at least one word line corresponding to the second target address according to a second target refresh command.

According to an embodiment of the present invention, an operation method of a memory device includes performing a first target refresh operation on a word line corresponding to a first target address in response to a first target refresh command, the first target address and the first target command being received from a memory controller; generating a second target address by sampling an active address in response to an active command; determining whether a number of inputs of a normal refresh command reaches a threshold; and performing a second target refresh operation on a word line corresponding to the second target address in response to the determination that the number of inputs of the normal refresh command reached the threshold.

According to embodiments of the present invention, the memory system may generate a final target address in a way that the memory controller may generate a first target address with a high number (or frequency) of activations and the memory device may generate a second target address with a random sampling. Since the memory controller and the memory device work together to sample the target addresses, the memory system may reduce the burden on the memory device while increasing the accuracy of the target refresh operation.

According to embodiments of the present invention, the memory device may select the second target address different from the first target address provided by the memory controller. Thus, the memory system may prevent an unnecessary target refresh operation according to the same address, thereby improving refresh efficiency.

According to embodiments of the present invention, the memory controller may track only a few bits of the active address to predict the frequency of the active address occurrence, and randomly sample the active addresses based on the predicted result to select the first target address from among the sampled active addresses. Thus, the memory system may maximize the address sampling accuracy while reducing the area burden on the memory controller.

According to embodiments of the present invention, the random sampling circuit used in the memory device and the random sampling circuit used in the memory controller may be implemented using different sampling algorithms. Thus, the memory system may eliminate the periodicity of the sampling circuit and further optimize the target address to select at least one word line during the target refresh operation.

DETAILED DESCRIPTION

Figure 1:
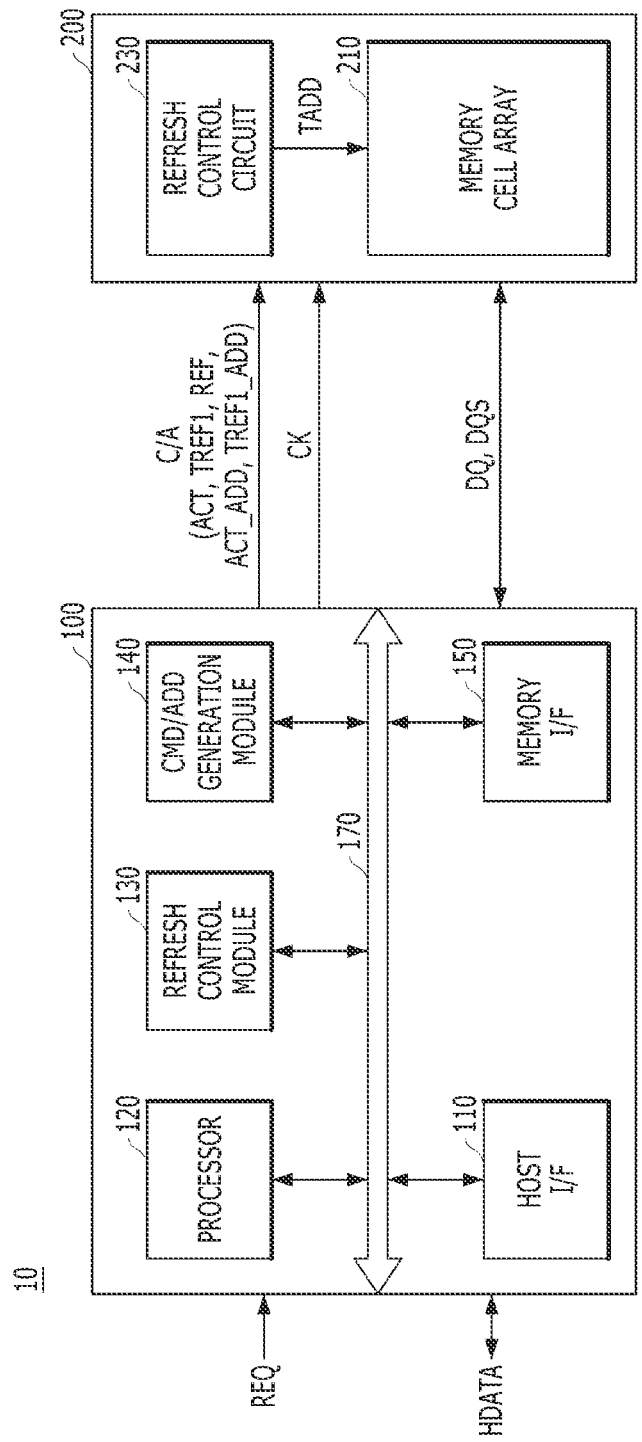
FIG. 1 is a block diagram illustrating a memory system in accordance with an embodiment of the present disclosure.

Various embodiments of the present disclosure will be described below in more detail with reference to the accompanying drawings. The present disclosure may have embodiments in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present disclosure.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Hereinafter, to focus on a refresh operation, a description of a configuration associated with a data input/output operation will be omitted. In particular, for ease of description, an address used by a memory controller in a memory system may be assigned by a reference numeral "_ADD", and an address used in a memory device may be assigned by a reference numeral "ADD_".

FIG. 1 is a block diagram illustrating a memory system 10 in accordance with an embodiment of the present disclosure.

Referring to FIG. 1, the memory system 10 may include a memory controller 100, and a semiconductor memory device 200.

The memory controller 100 may control the general operation of the memory system 10 and it may control general data exchange between a host and the semiconductor memory device 200. The memory controller 100 may generate a command/address signal C/A according to a request REQ from the host, and provide the generated command/address signal C/A to the semiconductor memory device 200. The memory controller 100 may provide a clock CK together with the command/address signal C/A to the semiconductor memory device 200. The memory controller 100 may provide data DQ corresponding to host data HDATA provided from the host to the semiconductor memory device 200 together with a data strobe signal DQS. The memory controller 100 may receive the data DQ read from the semiconductor memory device 200 together with the data strobe signal DQS, and provide the data DQ and the data strobe signal DQS to the host as the host data HDATA.

In detail, the memory controller 100 may include a host interface (host I/F) 110, a processor 120, a refresh control module 130, a command/address (CMD/ADD) generation module 140, a memory interface (memory I/F) 150, and a bus 170.

The host interface 110 may be configured to communicate with the host connected to the memory system 10 under the control of the processor 120. For example, the host interface 110 may receive the request REQ and the host data HDATA from the host, and provide the host data HDATA to the host by receiving the data DQ read from the semiconductor memory device 200 through the memory interface 150.

The processor 120 may perform various types of computational and/or other operations for controlling the semiconductor memory device 200, and/or may execute instructions in the form of firmware or other types of software. The processor 120 may receive the request REQ and the host data HDATA provided from the host through the host interface 110. The processor 120 may generate various commands corresponding to the request REQ, such as an active command ACT, a read command, a write command, and an address, to provide the commands to the refresh control module 130 and the command/address generation module 140. The processor 120 may transmit the host data HDATA to the memory interface 150. The address generated with the active command ACT may be defined as an active address ACT_ADD. The processor 120 may control overall operations of the host interface 110, the refresh control module 130, the command/address generation module 140, and the memory interface 150.

The refresh control module 130 may generate commands relating to a refresh operation, such as a normal refresh command REF and a first target refresh command TREF1, based on the active command ACT provided from the processor 120. The refresh control module 130 may generate the first target refresh command TREF1 after generating a set number of the normal refresh commands REF at regular intervals whenever the number of inputs of the active command ACT reaches a certain number. The refresh control module 130 may generate a first target address TREF1_ADD with a high number of activations or high frequency of activations. A detailed configuration of the refresh control module 130 in accordance with the embodiment will be described in FIGS. 2 to 7.

The command/address generation module 140 may generate the command/address signal C/A by scheduling the commands and address provided from the processor 120 and the refresh control module 130. The command/address generation module 140 may provide the active address ACT_ADD together with the active command ACT, as the command/address signal C/A, and provide the first target refresh command TREF1 together with the first target address TREF1_ADD as the command/address signal C/A.

The memory interface 150 may be configured to communicate with the semiconductor memory device 200 under the control of the processor 120. For example, the memory interface 150 may transmit the command/address signal C/A and the data DQ to the semiconductor memory device 200, and transmit the data DQ read from the semiconductor memory device 200 to the host interface 110.

The processor 120 may transmit data between the host interface 110, the refresh control module 130, the command/address generation module 140, and the memory interface 150 via the bus 170. According to an embodiment, the host interface 110, the refresh control module 130, the command/address generation module 140, and the memory interface 150 may communicate with each other independently without passing through the bus 170. For example, the refresh control module 130 and host interface 110 may communicate directly with each other without passing through the bus 170. The refresh control module 130 and the memory interface 150 may communicate with each other directly without passing through the bus 170. The host interface 110 and the memory interface 150 may also communicate directly with each other without passing through the bus 170.

The semiconductor memory device 200 may perform a refresh operation, a write operation, and a read operation according to the clock CK, the command/address signal C/A, the data strobe signal DQS, and/or the data DQ that are provided from the memory controller 100. The refresh operation may include a normal refresh operation in which the semiconductor memory device 200 sequentially refreshes a plurality of word lines during a normal refresh period, and a target refresh operation in which one or more neighboring word lines disposed adjacent to a word line having a large number (or frequency) of activations are refreshed, during a target refresh period.

The semiconductor memory device 200 may generate an internal command (ICMD of FIG. 8) and an internal address (IADD of FIG. 8) by buffering the command/address signal C/A, and generate an active command ACT, a precharge command PCG, a normal refresh command REF, and a first target refresh command TREF1, which are related to a row control operation, by decoding the command ICMD. The semiconductor memory device 200 may generate a second target refresh command (TREF2 of FIG. 8) whenever the number of inputs of the normal refresh command REF reaches a set number. That is, the first target refresh command TREF1 may be generated and provided from the memory controller 100 while the second target refresh command TREF2 may be generated by the semiconductor memory device 200 itself.

The semiconductor memory device 200 may perform the normal refresh operation according to the normal refresh command REF and perform the target refresh operation according to the first target refresh command TREF1 or the second target refresh command TREF2. For reference, the internal address IADD may correspond to the active address ACT_ADD when the active command ACT is generated. Depending on an embodiment, the internal address IADD may correspond to the first target address TREF1_ADD when the first target refresh command TREF1 is generated. Further, the semiconductor memory device 200 may additionally generate commands related to data input/output operations (e.g., a read command or a write command) by decoding the internal command ICMD.

In detail, the semiconductor memory device 200 may include a memory cell array 210 and a refresh control circuit 230.

The memory cell array 210 may include a plurality of memory cells coupled to a plurality of word lines and a plurality of bit lines, and may be arranged in the form of an array.

The refresh control circuit 230 may provide a final target address TADD to select a word line to be refreshed during the target refresh operation, among the word lines. The refresh control circuit 230 may generate a second target address (ADD_TREF2 of FIG. 8) by sampling the active address ACT_ADD according to the active command ACT. The refresh control circuit 230 may output the final target address TADD by selecting one of the first target address TREF1_ADD and the second target address ADD_TREF2 according to the second target refresh command TREF2. The refresh control circuit 230 may select the first target address TREF1_ADD when the second target refresh command TREF2 is not inputted, and select the second target address ADD_TREF2 different from the first target address TREF1_ADD when the second target refresh command TREF2 is inputted.

Accordingly, the semiconductor memory device 200 may perform the target refresh operation on a word line corresponding to the first target address TREF1_ADD in response to the first target refresh command TREF1, while performing the target refresh operation on a word line corresponding to the second target address ADD_TREF2, which is different from the first target address TREF1_ADD, in response to the second target refresh command TREF2. A detailed configuration of the semiconductor memory device 200 in accordance with the embodiment will be described in FIGS. 8 and 9.

As described above, in accordance with the embodiment of the present invention, the memory controller 100 may generate the first target address TREF1_ADD with a high number (or frequency) of activations, and the semiconductor memory device 200 may generate the second target address ADD_TREF2 with a random sampling. Since the memory controller and the memory device work together to generate the final target address TADD, the memory system 10 may reduce the burden on the semiconductor memory device 200 while increasing the accuracy of the target refresh operation.

Figure 2:
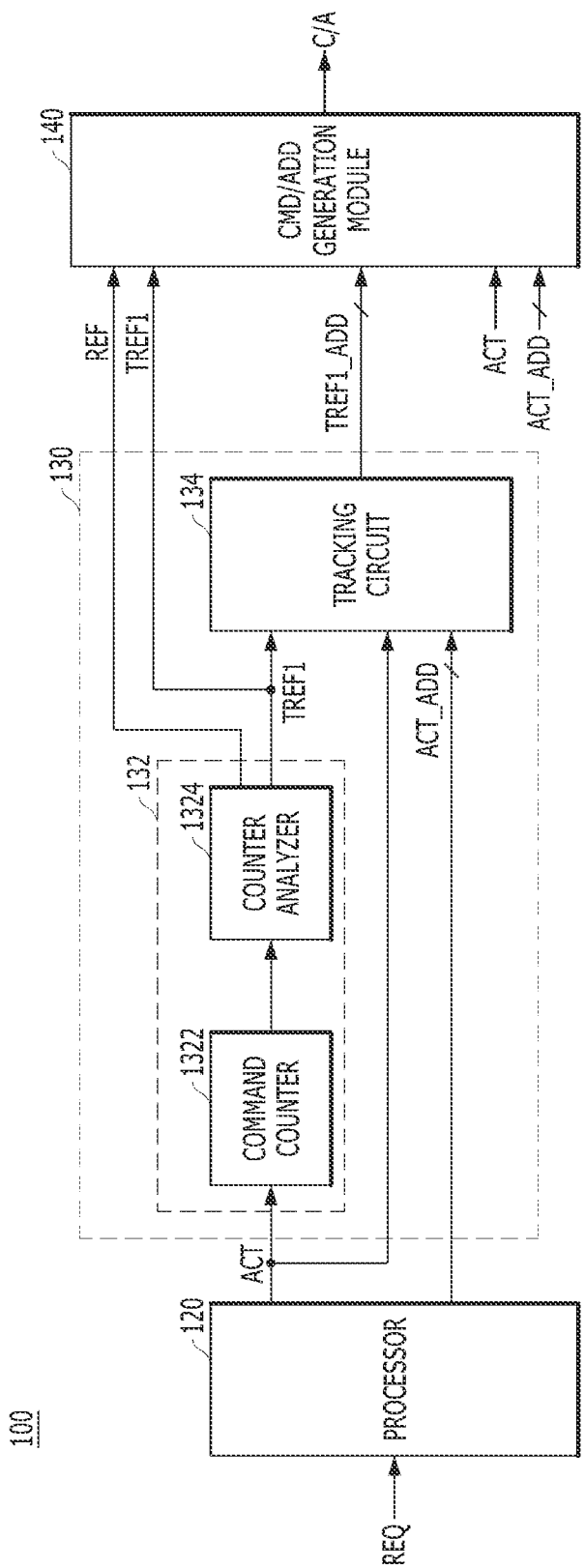
FIG. 2 is a detailed block diagram illustrating a refresh control module of a memory controller shown in FIG. 1 in accordance with an embodiment of the present disclosure.
Figure 3:
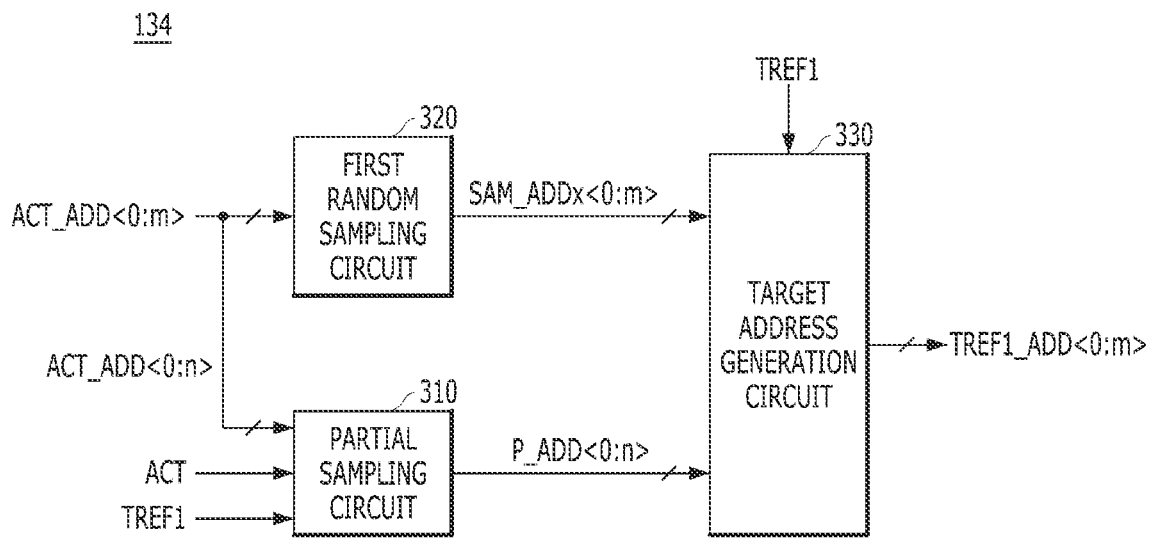
FIG. 3 is a detailed block diagram illustrating a tracking circuit of FIG. 2 in accordance with an embodiment of the present disclosure.

FIG. 2 is a detailed block diagram illustrating the refresh control module 130 of the memory controller 100 shown in FIG. 1 in accordance with an embodiment of the present disclosure. In FIG. 3, to focus on the characteristics of the embodiment, additional configurations (e.g., the host interface 110 and the memory interface 150) have been omitted. FIG. 3 is a detailed block diagram illustrating a tracking circuit 134 of FIG. 2 in accordance with an embodiment of the present disclosure.

Referring to FIG. 2, the processor 120 may receive the request REQ from the host through the host interface 110. The processor 120 may generate the active command ACT and the active address ACT_ADD corresponding to the request REQ.

The refresh control module 130 may include a refresh command issue circuit 132 and the tracking circuit 134.

The refresh command issue circuit 132 may generate the normal refresh command REF and the first target refresh command TREF1, based on the active command ACT provided from the processor 120. The refresh command issue circuit 132 may issue the first target refresh command TREF1 or the normal refresh command REF when the number of inputs of the active command ACT reaches a certain number.

For example, the refresh command issue circuit 132 may include a command counter 1322 and a counter analyzer 1324.

The command counter 1322 may generate a count value by counting the number of inputs of the active command ACT. The counter analyzer 1324 may issue a set number of the normal refresh commands REF at regular intervals when the count value reaches the certain number. The counter analyzer 1324 may issue the first target refresh command TREF1 after issuing the set number of the normal refresh commands REF. For example, the counter analyzer 1324 may issue at least one first target refresh command TREF1 after issuing 4096 normal refresh commands REF whenever the count value reaches 10.

The tracking circuit 134 may generate the first target address TREF1_ADD by sampling the active address ACT_ADD in response to the active command ACT. The tracking circuit 134 may output the first target address TREF1_ADD at each issue of the first target refresh command TREF1.

Referring to FIG. 3, the tracking circuit 134 may include a partial sampling circuit 310, a first random sampling circuit 320, and a target address generation circuit 330.

The partial sampling circuit 310 may store partial bits in the active address ACT_ADD (e.g., ACT_ADD<0:m>) as a partial address ACT_ADD<0:n>, where n and m are natural numbers, and n is less than m, according to the active command ACT. The partial sampling circuit 310 may set a priority address P_ADD<0:n> by counting the number of inputs of the partial address ACT_ADD<0:n>. The partial sampling circuit 310 may be initialized at each issue of the first target refresh command TREF1 to reset the priority address P_ADD<0:n>. The first random sampling circuit 320 may generate a plurality of sampling addresses SAM_ADDx<0:m> where x is a natural number greater than 1, by randomly sampling the active address ACT_ADD<0:m>. The target address generation circuit 330 may output any of the sampling addresses SAM_ADDx<0:m>, which are identical to the priority address P_ADD<0:n>, as the first target address TREF1_ADD<0:m>, in response to the first target refresh command TREF1.

Referring back to FIG. 2, the command/address generation module 140 may generate the command/address signal C/A by scheduling the active command ACT and the active address ACT_ADD provided from the processor 120, and the normal refresh commands REF, the first target refresh command TREF1, and the first target address TREF1_ADD provided from the refresh control module 130. The command/address generation module 140 may output the active address ACT_ADD together with the active command ACT, as the command/address signal C/A, and provide the normal refresh command REF as the command/address signal C/A, or the first target refresh command TREF1 together with the first target address TREF1_ADD as the command/address signal C/A.

Figure 4:
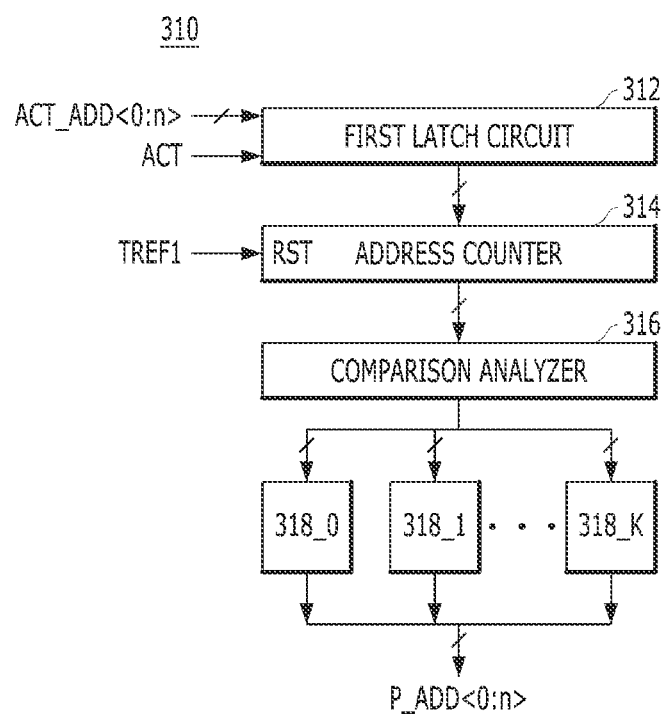
FIG. 4 is a detailed block diagram illustrating a partial sampling circuit of FIG. 3 in accordance with an embodiment of the present disclosure.
Figure 5:
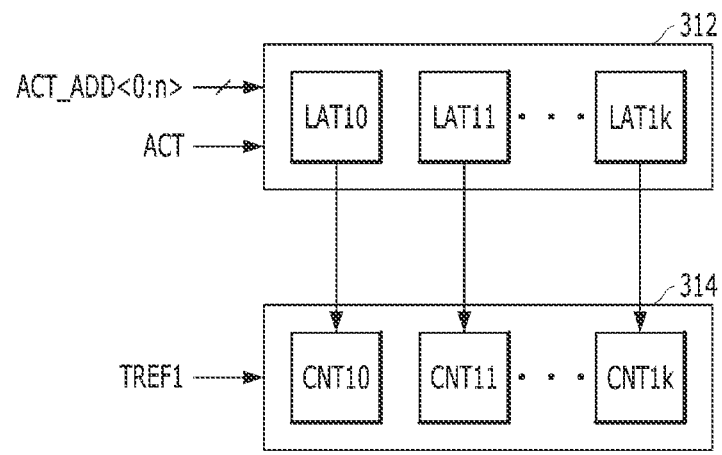
FIG. 5 is a detailed block diagram illustrating a first latch circuit and an address counter of FIG. 4 in accordance with an embodiment of the present disclosure.

FIG. 4 is a detailed block diagram illustrating the partial sampling circuit 310 of FIG. 3 in accordance with an embodiment of the present disclosure. FIG. 5 is a detailed block diagram illustrating a first latch circuit 312 and an address counter 314 of FIG. 4 in accordance with an embodiment of the present disclosure.

Referring to FIG. 4, the partial sampling circuit 310 may include the first latch circuit 312, the address counter 314, a comparison analyzer 316, and a plurality of priority address storages 318_0 to 318_k.

The first latch circuit 312 may store (n+1) bits in the active address ACT_ADD<0:m> of (m+1) bits as the partial address ACT_ADD<0:n> of (n+1) bits, when the active command ACT is inputted. For example, the first latch circuit 312 stores the lower 4 bits in the 12-bit active address ACT_ADD<0:11> as the 4-bit partial address ACT_ADD<0:3>. In an embodiment, the lower 4 bits in the active address ACT_ADD<0:11> may be used to specify the word lines of the memory cell array 210. Referring to FIG. 5, the first latch circuit 312 may include a plurality of latches LAT10 to LAT1k, each of which may store, as the partial address ACT_ADD<0:n>, (n+1) bits in the active address ACT_ADD<0:m> of (m+1) bits in response to the active command ACT. The first latch circuit 312 may store plural partial addresses ACT_ADD<0:n> for as many as a number of the latches LAT10 to LAT1k.

Referring back to FIG. 4, the address counter 314 may generate a plurality of counting values by counting the number of inputs of the partial address ACT_ADD<0:n> into each of the latches LAT10 to LAT1k whenever the same partial address ACT_ADD<0:n> is stored in a corresponding latch of the latches LAT10 to LAT1k in response to the active command ACT. The address counter 314 may be initialized by the first target refresh command TREF1. That is, the address counter 314 may cumulatively count the number of inputs of the partial address ACT_ADD<0:n> during each cycle of the issue of the first target refresh command TREF1. Referring to FIG. 5, the address counter 314 may include a plurality of counters CNT10 to CNT1k respectively corresponding to the latches LAT10 to LAT1k. Each of the counters CNT10 to CNT1k may increase its counting value by +1 whenever the same partial address ACT_ADD<0:n> is stored into a corresponding one of the latches LAT10 to LAT1*k*.

Referring back to FIG. 4, the comparison analyzer 316 may compare the counting values provided from the address counter 314 to arrange the partial addresses ACT_ADD<0:n> respectively stored in the latches LAT10 to LAT1*k* according to a priority in the descending order of the counting values. The comparison analyzer 316 may sequentially store, respectively into the priority address storages 318_0 to 318_*k*, the partial addresses ACT_ADD<0:n> arranged according to the priority. The priority address storages 318_0 to 318_*k* may output the priority address P_ADD<0:n> having the highest priority among the arranged partial addresses ACT_ADD<0:n> stored therein.

Figure 6:
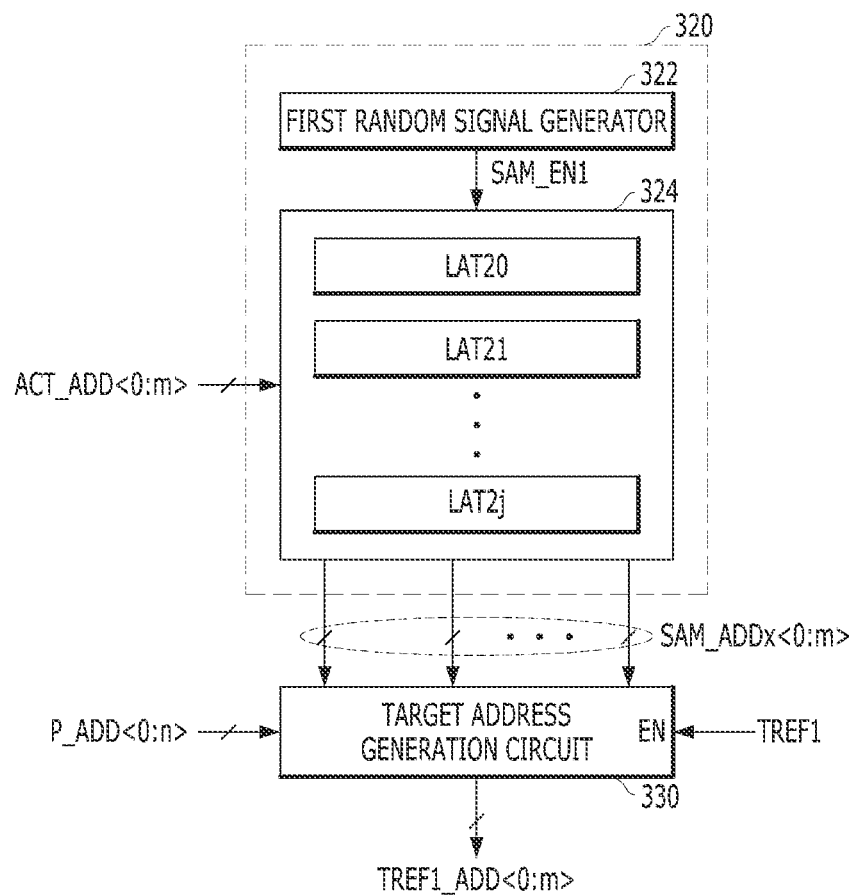
FIG. 6 is a detailed block diagram illustrating a first random sampling circuit of FIG. 3 in accordance with an embodiment of the present disclosure.
Figure 7:
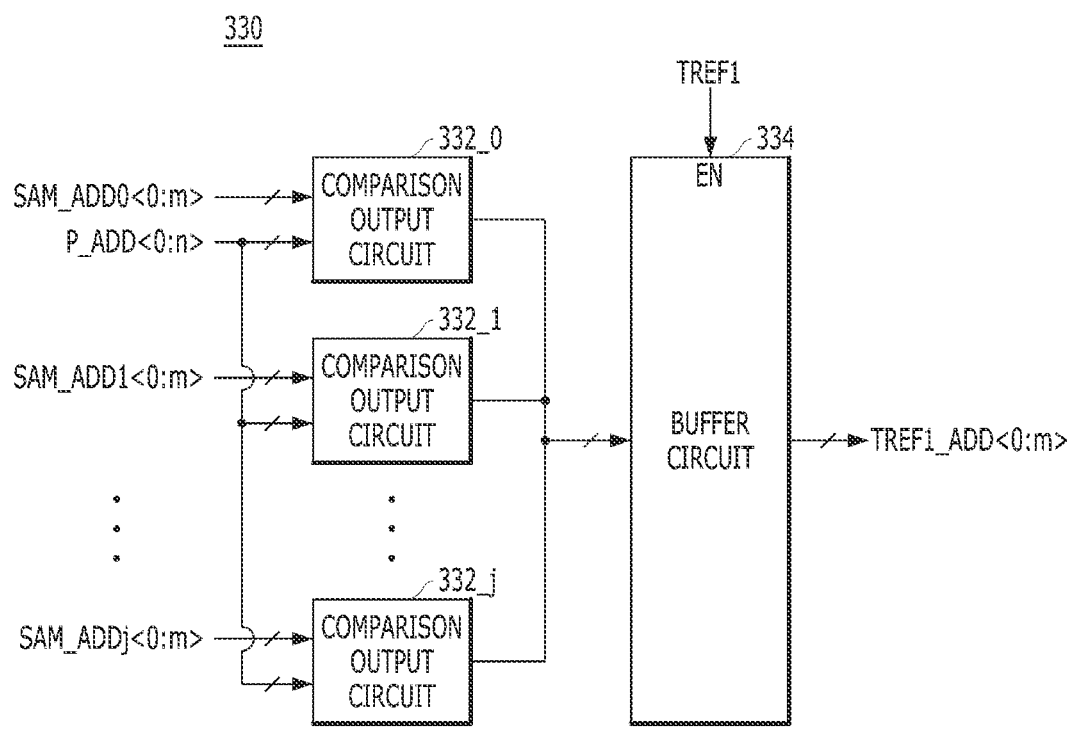
FIG. 7 is a detailed block diagram illustrating a target address generation circuit of FIG. 6 in accordance with an embodiment of the present disclosure.

FIG. 6 is a detailed block diagram illustrating the first random sampling circuit 320 of FIG. 3 in accordance with an embodiment of the present disclosure. FIG. 7 is a detailed block diagram illustrating the target address generation circuit 330 of FIG. 6 in accordance with an embodiment of the present disclosure.

Referring to FIG. 6, the first random sampling circuit 320 may include a first random signal generator 322 and a second latch circuit 324.

The first random signal generator 322 may generate a first sampling signal SAM_EN1 that is randomly enabled. The first random signal generator 322 may be implemented with a linear feedback shift register (LFSR) based random pattern generator.

The second latch circuit 324 may store the active address ACT_ADD<0:m> as the sampling addresses SAM_ADDx<0:m>, where x is a natural number from 0 to j, according to the first sampling signal SAM_EN1. For example, the second latch circuit 324 may include a plurality of latches LAT20 to LAT2*j*, which may sequentially store the active address ACT_ADD<0:m> as the sampling addresses SAM_ADDx<0:m> whenever the first sampling signal SAM_EN1 is enabled. At this time, since each of the latches LAT20 to LAT2*j* may store all of the bits (i.e., (m+1) bits) in the active address ACT_ADD<0:m>, the second latch circuit 324 may have a size larger than the first latch circuit 312.

The target address generation circuit 330 may be activated in response to the first target refresh command TREF1. The target address generation circuit 330 may output any of the sampling addresses SAM_ADDx<0:m>, which are identical to the priority address P_ADD<0:n>, as the first target address TREF1_ADD<0:m>, in response to the first target refresh command TREF1.

Referring to FIG. 7, the target address generation circuit 330 may include a plurality of comparison output circuits 332_0 to 332*j* and a buffer circuit 334.

The comparison output circuits 332_0 to 332_*j* may respectively correspond to the sampling addresses SAM_ADDx<0:m>. Each of the comparison output circuits 332_0 to 332*j* may output a corresponding sampling address of the sampling addresses SAM_ADDx<0:m> by comparing the corresponding sampling address with the priority address P_ADD<0:n>. Each of the comparison output circuits 332_0 to 332_*j* may output the corresponding sampling address when partial bits (e.g., SAM_ADDx<0:n>) in the corresponding sampling address are identical to all of the bits in the priority address P_ADD<0:n>. The buffer circuit 334 may buffer and output the sampling addresses SAM_ADDx<0:m> outputted from the comparison output circuits 332_0 to 332_*j* as the first target address TREF1_ADD<0:m>, in response to the first target refresh command TREF1.

For example, when the priority address P_ADD<0:3> of "0101" is inputted in a state that the first sampling address SAM_ADD0<0:11> is "110101010101" and the second sampling address SAM_ADD1<0:11> is "110101010111", the target address generation circuit 330 may output, as the first target address TREF1_ADD<0:11>, the first sampling address SAM_ADD0<0:11> whose lower 4 bits are identical to the priority address P_ADD<0:3> of "0101".

With the above configuration shown in FIGS. 2 to 7, the refresh control module 130 may generate the first target address TREF1_ADD with a high number (or frequency) of activations by counting the number of inputs of the active address ACT_ADD according to the active command ACT. The refresh control module 130 may track only a few bits of the active address ACT_ADD to predict the frequency of the active address occurrence, and randomly sample the active addresses ACT_ADD based on the predicted result to select the first target address TREF1_ADD from among the selected active addresses ACT_ADD. Thus, the memory system 10 may maximize the address sampling accuracy while reducing the area burden on the memory controller 100.

Figure 8:
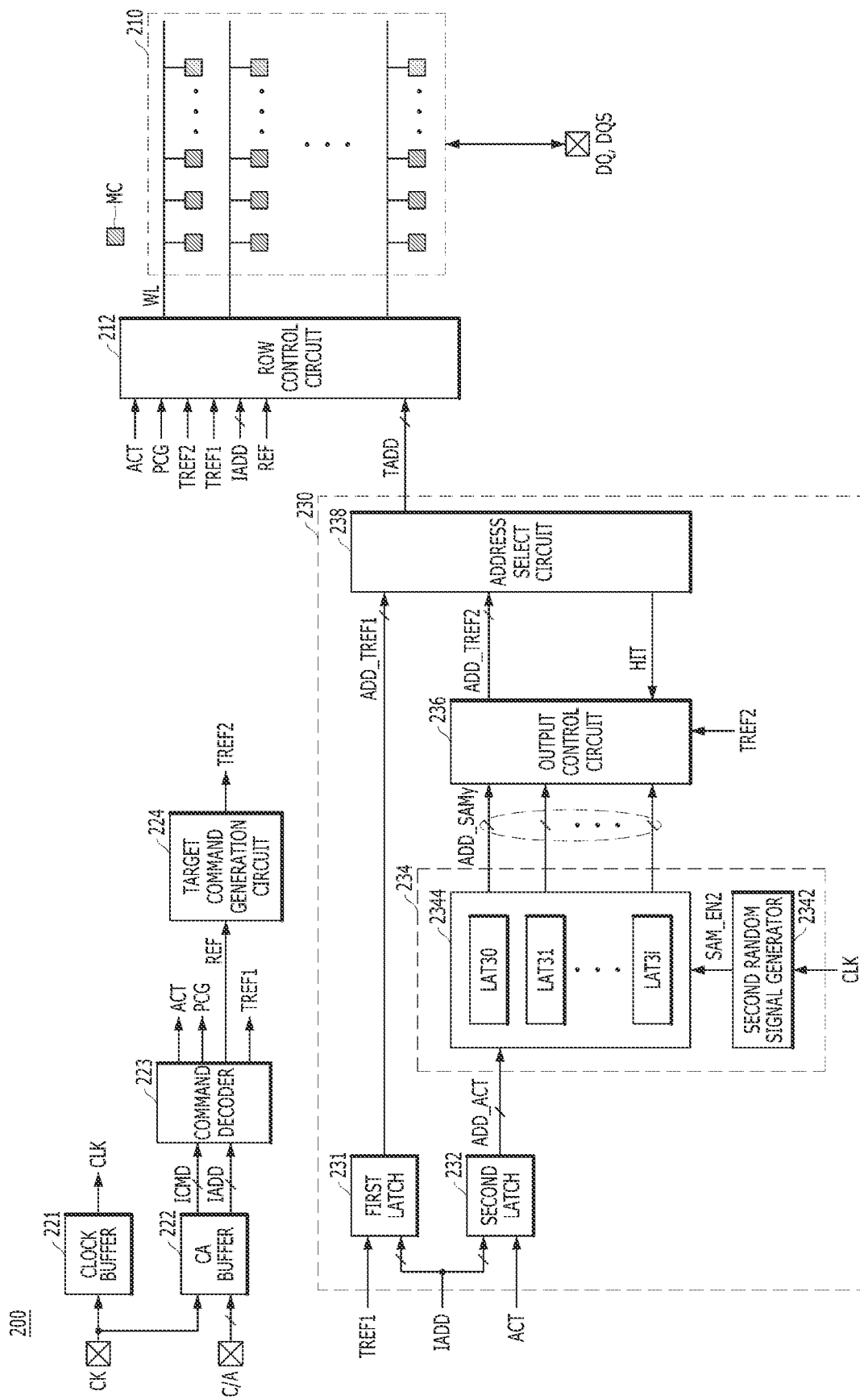
FIG. 8 is a detailed block diagram illustrating a memory device shown in FIG. 1 in accordance with an embodiment of the present disclosure.
Figure 9:
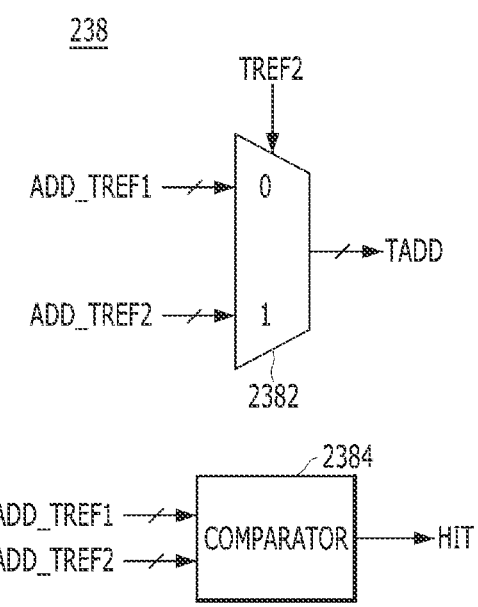
FIG. 9 is a detailed configuration diagram illustrating an address select circuit of FIG. 8 in accordance with an embodiment of the present disclosure.

FIG. 8 is a detailed block diagram illustrating the semiconductor memory device 200 shown in FIG. 1 in accordance with an embodiment of the present disclosure. FIG. 9 is a detailed configuration diagram illustrating an address select circuit 238 of FIG. 8 in accordance with an embodiment of the present disclosure.

Referring to FIG. 8, the semiconductor memory device 200 may include the memory cell array 210, a row control circuit 212, a clock buffer 221, a command/address (CA) buffer 222, a command decoder 223, a target command generation circuit 224, and the refresh control circuit 230.

The memory cell array 210 may include a plurality of memory cells MC coupled to word lines WL and bit lines may be arranged in the form of an array. The memory cell array 210 may be composed of at least one bank. The number of banks or the number of memory cells MC may be determined depending on the capacity of the semiconductor memory device 200.

The clock buffer 221 may receive a clock CK from the memory controller 100. The clock buffer 221 may generate an internal clock CLK by buffering the clock CK. Depending on an embodiment, the memory controller 100 may transfer system clocks CK_t and CK_c to the semiconductor memory device 200 in a differential manner, and the semiconductor memory device 200 may include clock buffers that receive the differential clocks CK_t and CK_c, respectively.

The CA buffer 222 may receive a command/address signal C/A from the memory controller 100 based on the clock CK. The CA buffer 222 may sample the command/address signal C/A based on the clock CK and output an internal command ICMD and an internal address IADD. Consequently, the semiconductor memory device 200 may be synchronized with the clock CK.

The command decoder 223 may decode the internal command ICMD which is output from the CA buffer 222 to generate an active command ACT, a precharge command PCG, a normal refresh command REF, and a first target refresh command TREF1. Although not illustrated, the command decoder 223 may additionally generate a read command RD, a write command WT, a mode register command MRS, and the like by decoding the internal command ICMD.

The target command generation circuit 224 may generate a second target refresh command TREF2 based on the normal refresh command REF. The target command generation circuit 224 may generate the second target refresh command TREF2 whenever the number of inputs of the normal refresh command REF reaches a certain number. In an embodiment, a frequency of the first target refresh command TREF1 issued by the refresh command issue circuit 132 of the memory controller 100 may be set differently from a frequency of the second target refresh command TREF2 issued by the target command generation circuit 224 of the semiconductor memory device 200. For example, the first target refresh command TREF1 may be generated after issuing 4096 normal refresh commands REF, and the second target refresh command TREF2 may be generated after issuing 8092 normal refresh commands REF.

The refresh control circuit 230 may latch the internal address IADD as a first target address ADD_TREF1 according to the first target refresh command TREF1. The refresh control circuit 230 may latch the internal address IADD as an active address ADD_ACT according to the active command ACT, and randomly sample the active address ADD_ACT to store a plurality of sampling addresses ADD_SAMy. The refresh control circuit 230 may sequentially output the sampling addresses ADD_SAMy as a second target address ADD_TREF2 according to the second target refresh command TREF2, while masking a current sampling address and outputting a next sampling address as the second target address ADD_TREF2 when the first target address ADD_TREF1 is identical to the second target address ADD_TREF2. The refresh control circuit 230 may output a final target address TADD by selecting any of the first target address ADD_TREF1 and the second target address ADD_TREF2 according to the second target refresh command TREF2.

For reference, the sampling addresses SAM_ADDx generated by the first random sampling circuit 320 of the memory controller 100 may be defined as primary sampling addresses, and the sampling addresses ADD_SAMy generated by the second random sampling circuit 234 of the semiconductor memory device 200 may be defined as secondary sampling addresses.

In detail, the refresh control circuit 230 may include a first latch 231, a second latch 232, a second random sampling circuit 234, an output control circuit 236, and an address select circuit 238.

The first latch 231 may output the first target address ADD_TREF1 by latching the internal address IADD according to the first target refresh command TREF1. The second latch 232 may output the active address ADD_ACT by latching the internal address IADD according to the active command ACT.

The second random sampling circuit 234 may generate the sampling addresses ADD_SAMy by randomly sampling the active address ADD_ACT.

In detail, the second random sampling circuit 234 may include a second random signal generator 2342 and a third latch circuit 2344.

The second random signal generator 2342 may generate a second sampling signal SAM_EN2 that is randomly toggling or periodically toggling, based on the internal clock CLK. The second random signal generator 2342 may be implemented with a pseudo-random binary sequence (PRBS) based random pattern generator.

The third latch circuit 2344 may store the active address ADD_ACT as the sampling addresses ADD_SAMy, where y is a natural number from 0 to i, according to the second sampling signal SAM_EN2. For example, the third latch circuit 2344 may include a plurality of latches LAT30 to LAT3i, which may sequentially store the active address ADD_ACT as the sampling addresses ADD_SAMy whenever the second sampling signal SAM_EN2 is enabled.

The output control circuit 236 may sequentially output the sampling addresses ADD_SAMy as the second target address ADD_TREF2 according to the second target refresh command TREF2. The output control circuit 236 may mask the current sampling address and output the next sampling address as the second target address ADD_TREF2 when a comparison signal HIT is enabled.

The address select circuit 238 may output the final target address TADD by selecting any of the first target address ADD_TREF1 and the second target address ADD_TREF2 according to the second target refresh command TREF2. The address select circuit 238 may generate the comparison signal HIT by comparing the first target address ADD_TREF1 with the second target address ADD_TREF2.

Referring to FIG. 9, the address select circuit 238 may include a selector 2382 and a comparator 2384.

The selector 2382 may output the final target address TADD by selecting any of the first target address ADD_TREF1 and the second target address ADD_TREF2 according to the second target refresh command TREF2. The comparator 2384 may compare the first target address ADD_TREF1 with the second target address ADD_TREF2, and enable the comparison signal HIT when respective bits in the first target address ADD_TREF1 are identical to those in the second target address ADD_TREF2.

Referring back to FIG. 8, the row control circuit 212 may activate a word line WL corresponding to the internal address IADD according to the active command ACT, and precharge the activated word line WL according to the precharge command PCG. In order to select a word line to be refreshed during the normal refresh operation, a refresh counter (not shown) for generating a counting address that is sequentially increasing according to the normal refresh command REF may be additionally provided. The row control circuit 212 may perform the normal refresh operation of sequentially refreshing the plurality of word lines WL corresponding to the counting address according to the normal refresh command REF. The row control circuit 212 may perform the target refresh operation of refreshing one or more neighboring word lines of a word line WL corresponding to the final target address TADD according to the first target refresh command TREF1 or the second target refresh command TREF2.

Though it is not shown, the memory device 200 may further include a column control circuit for selecting bit lines corresponding to the column address among the internal address IADD, according to the read command RD or the write command WT. The memory device 200 may output data DQ read from the memory cell array 210 through the bit lines, under the control of the column control circuit, together with a data strobe signal DQS to the memory interface 150 of the memory controller 100.

As described above, the semiconductor memory device 200 may perform the target refresh operation on adjacent word lines corresponding to the first target address ADD_TREF1 in response to the first target refresh command TREF1, and perform the target refresh operation on adjacent word lines corresponding to the second target address ADD_TREF2, which is different from the first target address ADD_TREF1, in response to the second target refresh command TREF2. Thus, the memory system 10 in accordance with an embodiment may prevent unnecessary target refresh operation according to the same address, thereby improving refresh efficiency.

Further, the second random signal generator 2342 used in the memory device 200 may generate the random sampling signal on a different scheme from the first random signal generator 322 used in the memory controller 100. Thus, the memory system 10 in accordance with an embodiment may compensate for the difficulties in randomization due to the periodicity of the sampling circuit by mixing sampling algorithms and further optimize the target refresh target selection.

In various embodiments of the present invention, although it is described as an example that the first random signal generator 322 is composed of the LFSR based random pattern generator while the second random signal generator 2342 is composed of the PRBS based random pattern generator, the present invention is not limited thereto. According to an embodiment, the first random signal generator 322 may be implemented with any selected from the LFSR based or PRBS based random pattern generator, and the second random signal generator 2342 may be implemented with the other random pattern generator. That is, according to an embodiment, the first random signal generator 322 may be implemented according to any selected from the LFSR based or PRBS based random pattern generating scheme, and the second random signal generator 2342 may be implemented according to the other random pattern generating scheme.

Hereinafter, referring to FIGS. 1 to 10B, an operation of a memory system will be described.

Figure 10A:
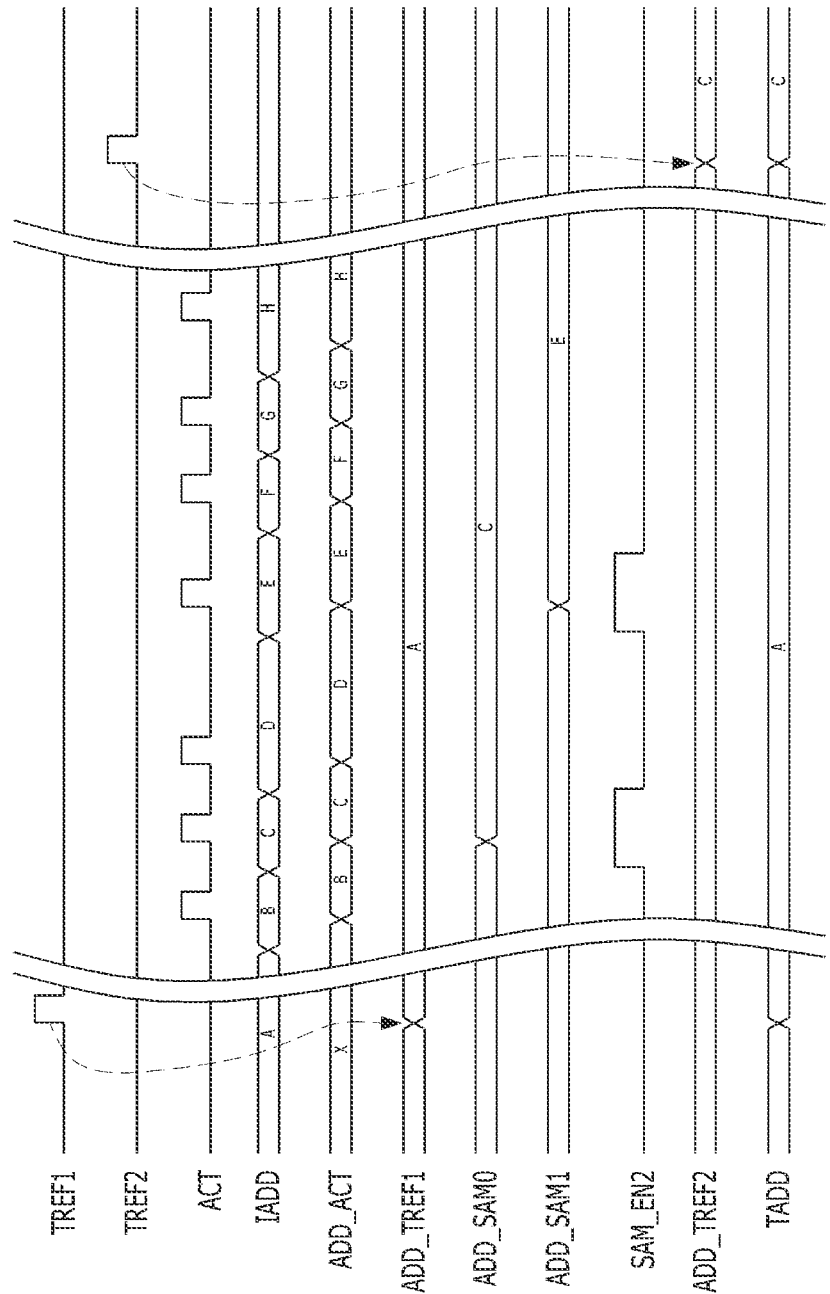
FIGS. 10A and 10B are timing diagrams for describing an operation of a memory system, in accordance with an embodiment of the present disclosure.
Figure 10B:
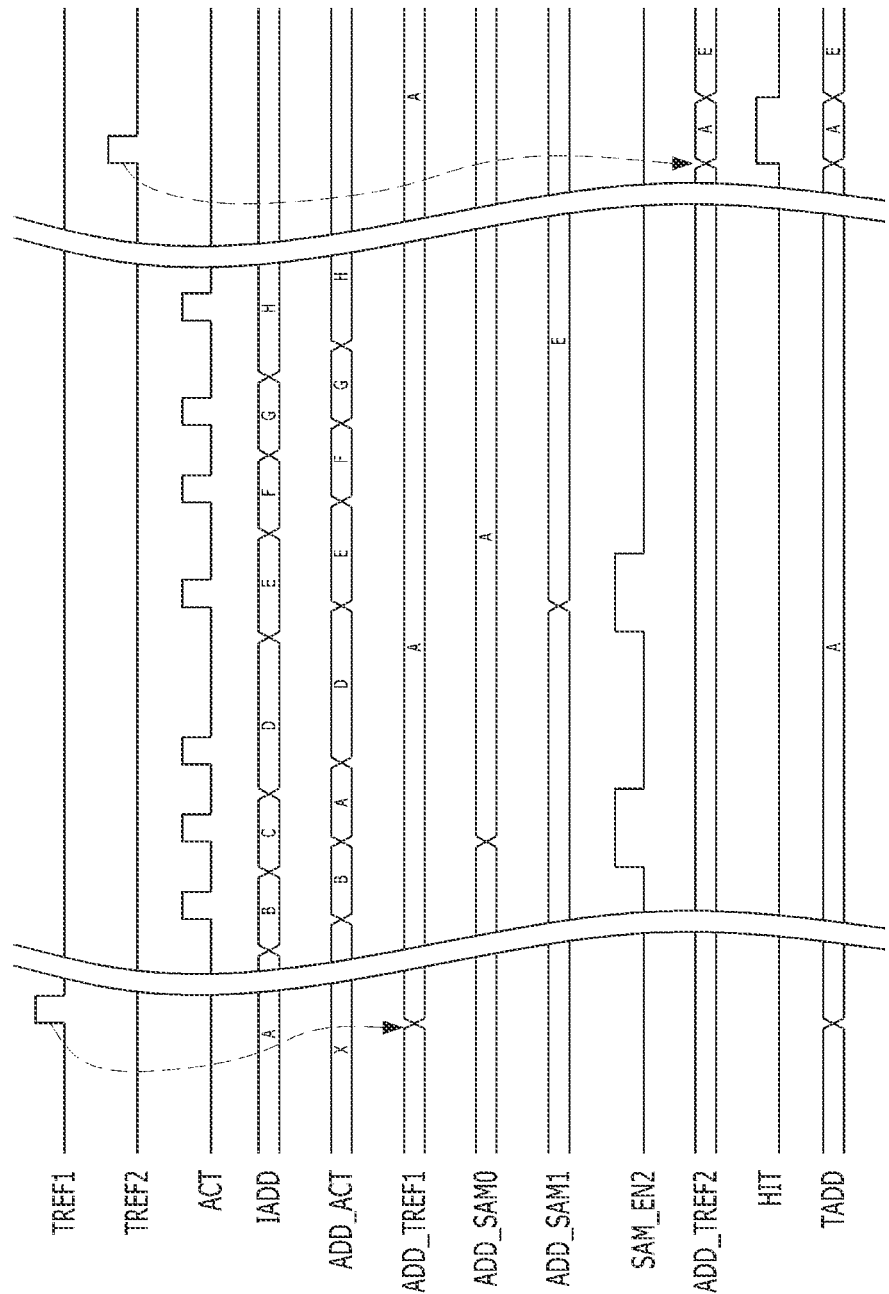

FIGS. 10A and 10B are timing diagrams for describing an operation of a memory system, in accordance with an embodiment of the present disclosure.

Referring to FIG. 10A, a case where the first target address ADD_TREF1 is different from the second target address ADD_TREF2 is shown.

The refresh command issue circuit 132 of the memory controller 100 may issue the first target refresh command TREF1 when the number of inputs of the active command ACT reaches a certain number. The tracking circuit 134 may generate the first target address TREF1_ADD by sampling the active address ACT_ADD in response to the active command ACT. The command/address generation module 140 may output the first target refresh command TREF1 together with the first target address TREF1_ADD as the command/address signal C/A.

The CA buffer 222 of the semiconductor memory device 200 may receive the command/address signal C/A from the memory controller 100 to output the internal command ICMD and the internal address IADD. The command decoder 223 may decode the internal command ICMD to generate the first target refresh command TREF1. At this time, the internal address IADD may correspond to the first target address TREF1_ADD. The refresh control circuit 230 may output the first target address ADD_TREF1 by latching the internal address IADD of "A" and output the final target address TADD by selecting the first target address ADD_TREF1, according to the first target refresh command TREF1. The row control circuit 212 may perform the target refresh operation of refreshing one or more neighboring word lines of a word line WL corresponding to the final target address TADD according to the first target refresh command TREF1. Particularly, the row control circuit 212 may perform the target refresh operation after a predetermined time from an activation of the first target refresh command TREF1.

Next, the processor 120 may generate the active command ACT and the active address ACT_ADD corresponding to the request REQ from the host. The command/address generation module 140 may provide the active address ACT_ADD together with the active command ACT, as the command/address signal C/A. The semiconductor memory device 200 may output the internal command ICMD and the internal address IADD according to the command/address signal C/A, and decode the internal command ICMD to generate the active command ACT. The row control circuit 212 may perform an active operation of activating a word line WL corresponding to the internal address IADD according to the active command ACT. Such an active operation may be repeatedly performed whenever the active command ACT is inputted.

Whenever the active command ACT is inputted, the second latch 232 may output the active address ADD_ACT by latching the internal address IADD, and the second random sampling circuit 234 may sequentially store the active address ADD_ACT as the sampling addresses ADD_SAMy during an activation section of the second sampling signal SAM_EN2 being enabled. For example, during a first activation section of the second sampling signal SAM_EN2, the active address ADD_ACT of "C" may be stored as the first sampling address ADD_SAM0. During a second activation section of the second sampling signal SAM_EN2, the active address ADD_ACT of "E" may be stored as the second sampling address ADD_SAM1.

Thereafter, the target command generation circuit 224 may generate the second target refresh command TREF2 when the number of inputs of the normal refresh command REF reaches the certain number. The output control circuit 236 may output the first sampling address ADD_SAM0 of "C" as the second target address ADD_TREF2 according to the second target refresh command TREF2. At this time, since the first target address ADD_TREF1 of "A" is different from the second target address ADD_TREF2 of "C", the address select circuit 238 may disable the comparison signal HIT. The address select circuit 238 may output the final target address TADD by selecting the second target address ADD_TREF2 according to the second target refresh command TREF2. The row control circuit 212 may perform the target refresh operation of refreshing one or more neighboring word lines of a word line WL corresponding to the final target address TADD according to the second target refresh command TREF2. Particularly, the row control circuit 212 may perform the target refresh operation after a predetermined time from an activation of the second target refresh command TREF2.

Referring to FIG. 10B, a case where the first target address ADD_TREF1 is identical to the second target address ADD_TREF2 is shown. In FIG. 10B, the active address ADD_ACT of "A" may be stored as the first sampling address ADD_SAM0 during a first activation section of the second sampling signal SAM_EN2, and the active address ADD_ACT of "E" may be stored as the second sampling address ADD_SAM1 during a second activation section of the second sampling signal SAM_EN2.

The output control circuit 236 may output the first sampling address ADD_SAM0 of "A" as the second target address ADD_TREF2 according to the second target refresh command TREF2. At this time, since the first target address ADD_TREF1 of "A" is identical to the second target address ADD_TREF2 of "A", the address select circuit 238 may enable the comparison signal HIT. Thus, the output control circuit 236 may mask the first sampling address ADD_SAM0 of "A" but output the second sampling address ADD_SAM1 of "E" as the second target address ADD_TREF2. The address select circuit 238 may output the final target address TADD by selecting the second target address ADD_TREF2 of "E" according to the second target refresh command TREF2. The row control circuit 212 may perform the target refresh operation of refreshing one or more neighboring word lines of a word line WL corresponding to the final target address TADD according to the second target refresh command TREF2. Particularly, the row control circuit 212 may perform the target refresh operation after a predetermined time from an activation of the second target refresh command TREF2.

As described above, the memory device 200 may perform the target refresh operation according to the second target address ADD_TREF2 different from the first target address ADD_TREF1 corresponding to the recently refreshed word lines. Thus, the memory system 10 may prevent an unnecessary target refresh operation according to the same address, thereby improving refresh efficiency.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory system, comprising:
   a memory controller suitable for:
   generating a first target address based on a priority address generated by counting a number of inputs of a partial address corresponding to partial bits of an active address and a plurality of primary sampling addresses generated by sampling the active address,
   providing the active address together with an active command, and providing a first target refresh command together with the first target address; and
   a memory device suitable for:
   generating a second target address based on a plurality of secondary sampling addresses which are generated by randomly sampling the active address according to the active command,
   performing a target refresh operation on at least one word line corresponding to the first target address according to the first target refresh command, and
   performing the target refresh operation on at least one word line corresponding to the second target address different from the first target address according to a second target refresh command.

2. The memory system of claim 1,
   wherein the memory controller includes one selected from a linear feedback shift register (LFSR) based random pattern generator and a pseudo-random binary sequence (PRBS) based random pattern generator, and wherein the memory controller includes the other one of the random pattern generators.

3. The memory system of claim 1,
   wherein the memory controller is further suitable for generating the first target refresh command whenever a number of inputs of the active command reaches a certain number, and
   wherein the memory device is further suitable for generating the second target refresh command whenever a number of inputs of the normal refresh command reaches a set number.

4. The memory system of claim 1, wherein the memory controller includes:
   a refresh command issue circuit suitable for issuing the first target refresh command when a number of inputs of the active command reaches a certain number;
   a partial sampling circuit suitable for:
   storing, as the partial address, the partial bits in the active address according to the active command, and
   setting the priority address by counting the number of inputs of the partial address;
   a first random sampling circuit suitable for generating the primary sampling addresses by randomly sampling the active address; and
   a target address generation circuit suitable for outputting, as the first target address, any of the primary sampling addresses, which are identical to the priority address, in response to the first target refresh command.

5. The memory system of claim 4, wherein the refresh command issue circuit includes:
   a command counter suitable for generating a count value by counting the number of inputs of the active command; and
   a counter analyzer suitable for issuing the first target refresh command after generating a set number of normal refresh commands at regular intervals when the count value reaches the certain number.

6. The memory system of claim 4, wherein the partial sampling circuit includes:
   a first latch circuit including a plurality of latches each suitable for storing, as the partial address, the partial bits in the active address in response to the active command;
   an address counter suitable for generating a plurality of counting values by counting a number of inputs of an identical partial address into each of the latches during each cycle of the issue of the first target refresh command;
   a comparison analyzer suitable for arranging the partial addresses stored in the latches according to a priority by comparing the counting values; and
   a plurality of priority address storages suitable for sequentially storing therein the respective partial addresses arranged according to the priority, and outputting the priority address having a highest priority among the arranged partial addresses stored therein.

7. The memory system of claim 4, wherein the first random sampling circuit includes:
   a first random signal generator suitable for generating a first sampling signal that is randomly enabled; and
   a second latch circuit suitable for sequentially storing the active address, as the primary sampling addresses, into a plurality of latches according to the first sampling signal.

8. The memory system of claim 4, wherein the target address generation circuit includes:

a plurality of comparison output circuits each suitable for outputting a corresponding primary sampling address of the primary sampling addresses, when the corresponding primary sampling address is the same as the priority address, by comparing the corresponding primary sampling address with the priority address; and a buffer circuit suitable for outputting, as the first target address, the primary sampling addresses outputted from the comparison output circuits in response to the first target refresh command.

9. The memory system of claim 1, wherein the memory device includes:

a second random sampling circuit suitable for generating the plurality of secondary sampling addresses by randomly sampling the active address;

an output control circuit suitable for sequentially outputting the secondary sampling addresses as the second target address according to the second target refresh command, while masking a current secondary sampling address in response to a comparison signal; and an address select circuit suitable for outputting a final target address by selecting any of the first target address and the second target address according to the second target refresh command and generating the comparison signal, when the first target address is the same as the second target address, by comparing the first target address with the second target address.

10. The memory system of claim 9, wherein the second random sampling circuit includes:

a second random signal generator suitable for generating a second sampling signal that is randomly enabled; and a third latch circuit suitable for sequentially storing the active address, as the secondary sampling addresses, into a plurality of latches according to the second sampling signal.

11. The memory system of claim 9, wherein the memory device further comprises a row control circuit suitable for performing the target refresh operation on the word line corresponding to the final target address according to the first target refresh command or the second target refresh command.

12. A semiconductor memory device, comprising:

a first latch suitable for outputting a first target address by latching an internal address according to a first target refresh command;

a second latch suitable for outputting an active address by latching the internal address according to an active command;

a second random sampling circuit suitable for generating sampling addresses by randomly sampling the active address;

an output control circuit suitable for sequentially outputting the sampling addresses as a second target address according to a second target refresh command, while masking a current sampling address in response to a comparison signal; and an address select circuit suitable for outputting a final target address by selecting any of the first target address and the second target address according to the second target refresh command, and generating the comparison signal, when the first target address is the same as the second target address, by comparing the first target address with the second target address.

13. The semiconductor memory device of claim 12, further comprising a row control circuit suitable for performing a target refresh operation on at least one word line corresponding to the final target address according to the first target refresh command or the second target refresh command.

14. The semiconductor memory device of claim 12, wherein the second random sampling circuit includes:

a random signal generator suitable for generating a sampling signal that is randomly enabled; and a latch circuit suitable for sequentially storing the active address, as the sampling addresses, into a plurality of latches according to the sampling signal.

15. The semiconductor memory device of claim 12, wherein the address select circuit includes:

a selector suitable for outputting the final target address by selecting any of the first target address and the second target address according to the second target refresh command; and a comparator suitable for comparing the first target address with the second target address and generating the comparison signal when the first target address is identical to the second target address.

16. The semiconductor memory device of claim 12, further comprising:

a command decoder suitable for decoding a command to generate a normal refresh command, the first target refresh command, and the active command; and a target command generation circuit suitable for generating the second target refresh command when a number of inputs of the normal refresh command reaches a certain number.

17. An operation method of a memory system, comprising:

generating, at a memory controller, a priority address by counting a number of inputs of a partial address corresponding to partial bits of an active address, and generating a plurality of primary sampling addresses by sampling the active address to generate a first target address based on the priority address and the primary sampling addresses;

providing, at the memory controller, the active address together with the active command;

providing, at the memory controller, a first target refresh command together with the first target address;

performing, at a memory device, a target refresh operation on at least one word line corresponding to the first target address according to the first target refresh command;

generating, at the memory device, a second target address based on a plurality of secondary sampling addresses which are generated by randomly sampling the active address according to the active command; and performing, at the memory device, the target refresh operation on at least one word line corresponding to the second target address different from the first target address according to a second target refresh command.

18. The operation method of claim 17, wherein the generating of the first target address includes:

storing, as the partial address, the partial bits in the active address according to the active command;

setting the priority address by counting the number of inputs of the partial address; and generating the primary sampling addresses by randomly sampling the active address;

outputting, as the first target address, any of the primary sampling addresses, which are identical to the priority address in response to the first target refresh command.

19. The operation method of claim 18,
wherein the generating of the first target address includes sampling the active address according to one selected from a linear feedback shift register (LFSR) based random pattern generating scheme and a pseudo-random binary sequence (PRBS) based random pattern generating scheme, and
wherein the generating of the second target address includes sampling the active address according to the other random pattern generating scheme.

20. The operation method of claim 17, wherein the generating of the second target address includes:
generating the plurality of secondary sampling addresses by randomly sampling the active address;
sequentially outputting the secondary sampling addresses as the second target address according to the second target refresh command;
masking a current secondary sampling address and outputting a next secondary sampling address, when the first target address is identical to the second target address; and
outputting a final target address by selecting any of the first target address and the second target address according to the second target refresh command.

21. The operation method of claim 17, further comprising:
generating, at the memory controller, the first target refresh command whenever a number of inputs of the active command reaches a certain number; and
generating, at the memory device, the second target refresh command whenever a number of inputs of the normal refresh command reaches a set number.

\* \* \* \* \*